United States Patent
Wang

(10) Patent No.: US 12,278,564 B2
(45) Date of Patent: Apr. 15, 2025

(54) TEMPERATURE CONTROL METHOD FOR POWER SUPPLY CONVERSION CHIP, RELATED ASSEMBLY, AND MULTI-PHASE POWER SUPPLY APPARATUS

(71) Applicant: SUZHOU METABRAIN INTELLIGENT TECHNOLOGY CO., LTD., Jiangsu (CN)

(72) Inventor: Jian Wang, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/725,059

(22) PCT Filed: Jan. 5, 2023

(86) PCT No.: PCT/CN2023/070751
§ 371 (c)(1),
(2) Date: Jun. 27, 2024

(87) PCT Pub. No.: WO2024/045469
PCT Pub. Date: Mar. 7, 2024

(65) Prior Publication Data
US 2024/0421706 A1    Dec. 19, 2024

(30) Foreign Application Priority Data
Aug. 29, 2022  (CN) .......................... 202211037116.3

(51) Int. Cl.
*H02M 3/156* (2006.01)
*G01K 7/01* (2006.01)
*G01R 19/00* (2006.01)

(52) U.S. Cl.
CPC ............. *H02M 3/156* (2013.01); *G01K 7/01* (2013.01); *G01R 19/0092* (2013.01)

(58) Field of Classification Search
CPC .... H02M 3/1582; H02M 3/156; H02M 3/157; H02M 3/158; H02M 3/1584;
(Continued)

(56) References Cited

U.S. PATENT DOCUMENTS

| | | | |
|---|---|---|---|
| 10,566,925 B2* | 2/2020 | Suzuki | H02P 29/68 |
| 2011/0025292 A1* | 2/2011 | Huang | H02J 1/102 |
| | | | 323/318 |

(Continued)

FOREIGN PATENT DOCUMENTS

| | | |
|---|---|---|
| CN | 103715863 A | 4/2014 |
| CN | 103872915 A | 6/2014 |

(Continued)

OTHER PUBLICATIONS

Corresponding International Patent Application No. PCT/CN2023/070751, International Search Report, Date Mailed May 5, 2023.
(Continued)

*Primary Examiner* — Jeffrey A Gblende
(74) *Attorney, Agent, or Firm* — Cooper Legal Group, LLC

(57) ABSTRACT

The present application relates to the field of power electronics technology control, and discloses a temperature control method for a power supply conversion chip, a related assembly, and a multi-phase power supply apparatus. A real-time average value of current temperature accumulation values of power supply conversion chips is calculated, and the output current of the power supply conversion chip whose current temperature accumulation value is not equal to the real-time average value is increased or decreased. The temperature of a power supply conversion chip increases as the output current increases and decreases as the output current decreases, and the temperature of the power supply
(Continued)

conversion chip changes under a condition that the output current of the power supply conversion chip is adjusted.

20 Claims, 6 Drawing Sheets

(58) Field of Classification Search
CPC ............... H02M 3/1586; H02M 3/285; H02M 3/33561; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 1/007; H02M 1/0009; H02M 1/08; H02M 3/1588; H02M 7/5395; H02M 1/14; H02M 1/0043; H02M 1/0074; H02M 1/0077; H02J 3/46; H02J 3/38
See application file for complete search history.

(56) References Cited

U.S. PATENT DOCUMENTS

| | | | |
|---|---|---|---|
| 2011/0115447 | A1 | 5/2011 | Lin et al. |
| 2022/0069696 | A1* | 3/2022 | Takegami ............. H02M 1/007 |

FOREIGN PATENT DOCUMENTS

| | | |
|---|---|---|
| CN | 109659905 A | 4/2019 |
| CN | 111367395 A | 7/2020 |
| CN | 114499177 A | 5/2022 |
| CN | 114815946 A | 7/2022 |
| CN | 115133758 A | 9/2022 |

OTHER PUBLICATIONS

Corresponding International Patent Application No. PCT/CN2023/070751, Written Opinion, Date Mailed May 5, 2023.
Corresponding Chinese Patent Application No. CN202211037116.3, Notice for Patent Grant dated Oct. 17, 2022.

* cited by examiner

TEMPERATURE CONTROL METHOD FOR POWER SUPPLY CONVERSION CHIP, RELATED ASSEMBLY, AND MULTI-PHASE POWER SUPPLY APPARATUS

CROSS-REFERENCE TO RELATED APPLICATION

This application claims priority to Chinese Patent Application No. 202211037116.3, filed on Aug. 29, 2022 in China National Intellectual Property Administration and entitled "Temperature Control Method for Power supply conversion Chip, Related Assembly, and Multi-Phase Power Supply Apparatus", which is hereby incorporated by reference in its entirety.

FIELD

The present application relates to a field of power electronics technology control, and in particular to a temperature control method for a power supply conversion chip, a related assembly, and a multi-phase power supply apparatus.

BACKGROUND

With a rise in power consumption of a server central processing unit (CPU), required current specifications are increasing, and power supply capability of a single power supply is no longer sufficient to meet current requirements of the CPU. Therefore, a current trend is to adopt multi-phase power supply architectures, where a plurality of single-phase power supplies is used in parallel to enhance current output capacity.

A multi-phase power supply includes a controller and a power stage (PS). Referring to FIG. 1, FIG. 1 is a structural diagram of a multi-phase power supply in the prior art. In FIG. 1, taking two power supply conversion chips connected behind a controller as an example, a number of power supply conversion chips in parallel is a number of phases of the power supply. The power supply conversion chip is the PS. The controller adjusts output currents and output voltages of each power supply conversion chip by outputting control signals of different sizes to supply power to a back-end electric device.

In addition, each power supply conversion chip is provided with a current detection module and a temperature detection module. The current detection module detects an output current of the power supply conversion chip where it is located and sends the same to the controller through a current feedback end of the power supply conversion chip. The temperature detection module detects a temperature of the power supply conversion chip where it is located and sends same to the controller through a temperature feedback end of the power supply conversion chip. The controller monitors the output current and temperature of each power supply conversion chip, to control the power supply conversion chip to stop outputting under a condition that the output current or temperature of the power supply conversion chip is abnormal, avoiding damage to the power supply conversion chip or the back-end electric device.

The controller usually has a plurality of current signal input ends, namely, each current signal input end of the controller may be connected to the current feedback end of each power supply conversion chip in a one-to-one correspondence manner, respectively, to receive a feedback value of the output current of each power supply conversion chip, and further to determine the output current of each power supply conversion chip, respectively. However, due to the current controller, size and process, the controller has one temperature signal input end to receive temperature detection values from each power supply conversion chip. This means that temperature feedback ends of each power supply conversion chip need to be connected in parallel to connect to a same temperature signal input end of the controller. The controller may identify a power supply conversion chip with a highest temperature, and under a condition that the temperature of this chip triggers over-temperature protection, the controller will shut down all the power supply conversion chips to stop outputting of the power supply conversion chips, avoiding overheating and damage to the power supply conversion chips.

Since the current controller may monitor the temperatures of the power supply conversion chips uniformly through one temperature signal input end, the controller is unable to obtain individual temperature information about each power supply conversion chip. The prior art usually controls current equalization flowing through each power supply conversion chip to ensure temperature equalization between different power supply conversion chips and prevent all the power supply conversion chips from normally outputting due to temperature abnormality of a few power supply conversion chips, thereby disrupting the normal power supply to the back-end. However, this method is applicable to scenarios where the arrangement positions of the power supply conversion chips are relatively concentrated.

Referring to FIG. 2a, FIG. 2a is a structural diagram of an arrangement position of a first type of power supply conversion chip in the prior art. For example, taking the CPU as the back-end electric device, in order to meet a 350 W power demand of the CPU, an 8-phase power supply is used. Arrangement positions of 8 power supply conversion chips being relatively concentrated. By equalizing the current flowing through each power supply conversion chip, the heat generation on the power supply conversion chip is also equalized, thereby enabling temperature equalization functionality.

However, under a condition that the CPU requires a 10-phase power supply, there may not be enough space on one side of the CPU to accommodate all 10 power supply conversion chips, necessitating a two-sided arrangement method. Referring to FIG. 2b, FIG. 2b is a structural diagram of an arrangement position of a second type of power supply conversion chip in the prior art. With 5 power supply conversion chips arranged on each side of the CPU, and such an arrangement meets space requirements. Nevertheless, as the CPU requires heat dissipation and often uses air cooling, 5 power supply conversion chips on one side will be positioned downwind of the CPU, leading to an ambient temperature of the 5 power supply conversion chips around 30° C. higher than the other 5 power supply conversion chips. Consequently, attempting to equalize the current among all chips may result in significantly higher temperatures in one group of 5 power supply conversion chips compared to the other group. Under a condition that the current through the power supply conversion chips is high, the temperatures will also be too high, thus triggering the over-temperature protection of the controller, potentially failing to meet the power supply requirements of the CPU.

SUMMARY

An object of the present application is to provide a temperature control method for a power supply conversion chip, a related assembly, and a multi-phase power supply apparatus. The output currents of the power supply conversion chips are adjusted, whereby the temperatures of the power supply conversion chips are equalized to avoid false triggering of over-temperature protection of the controller caused by the excess temperature of a few power supply conversion chips, thereby ensuring stable power supply to an electric device.

To solve the above technical problem, the present application provides a temperature control method for a power supply conversion chip applied to a controller in a multi-phase power supply; each power supply conversion chip in the multi-phase power supply includes an accumulator having a first end connected to a current feedback end of the power supply conversion chip, a second end connected to a temperature feedback end of the power supply conversion chip, and an output end connected to a current signal input end of the controller, the accumulator configured to send a current temperature accumulation value after adding a current detection value and a temperature detection value of the power supply conversion chip to the controller, and temperatures of the power supply conversion chips increase as output currents increase and decrease as the output currents decrease.

The method includes:
 calculating a real-time average value of the current temperature accumulation values sent by the power supply conversion chips; and
 adjusting the output current of the power supply conversion chip with the current temperature accumulation value not equal to the real-time average value, whereby the current temperature accumulation value of the power supply conversion chip is the real-time average value.

In some embodiments, the adjusting the output current of the power supply conversion chip with the current temperature accumulation value not equal to the real-time average value, whereby the current temperature accumulation value of the power supply conversion chip is the real-time average value includes:
 comparing the current temperature accumulation values sent by the power supply conversion chips with the real-time average value;
 controlling the output current of the power supply conversion chip with the current temperature accumulation value greater than the real-time average value to decrease, whereby the current temperature accumulation value of the power supply conversion chip is the real-time average value; and
 controlling the output current of the power supply conversion chip with the current temperature accumulation value less than the real-time average value to increase, whereby the current temperature accumulation value of the power supply conversion chip is the real-time average value.

In some embodiments, enable signal output ends of the controller are connected to enable ends of the power supply conversion chips; output ends of the power supply conversion chips, after being connected in parallel, are connected to a power supply end of an electric device.

The calculating a real-time average value of the current temperature accumulation values sent by the power supply conversion chips includes:
 sending enable signals to the power supply conversion chips to enable the power supply conversion chips;
 adjusting the output currents of the power supply conversion chips based on a power supply demand current of the electric device; and
 receiving, under a condition that the power supply conversion chips supply power to the electric device, the current temperature accumulation values sent by the power supply conversion chips, and calculating the real-time average value.

In some embodiments, the temperature feedback ends of the power supply conversion chips, after being connected in parallel, are connected to a temperature signal input end of the controller.

After the adjusting the output current of the power supply conversion chip with the current temperature accumulation value not equal to the real-time average value, whereby the current temperature accumulation value of the power supply conversion chip is the real-time average value, the method further includes:
 determining whether the temperature detection value of the temperature signal input end of the controller is greater than an overheating protection threshold; and
 in response to a determination that the temperature detection value of the temperature signal input end of the controller is greater than the overheating protection threshold, controlling the power supply conversion chips to stop working.

In some embodiments, a prompt signal output end of the controller is connected to a prompt module.

After the controlling the power supply conversion chips to stop working, the method further includes:
 performing power supply conversion chip over-temperature prompt through the prompt module.

In some embodiments, the prompt module includes a display prompt module and/or a sound prompt module.

The performing power supply conversion chip over-temperature prompt through the prompt module includes:
 performing power supply conversion chip over-temperature display prompt through the display prompt module and/or performing power supply conversion chip over-temperature sound prompt through the sound prompt module.

In some embodiments, each power supply conversion chip further includes an anti-reflection diode having an input end connected to the temperature feedback end of the power supply conversion chip and an output end connected to the temperature signal input end of the controller.

To solve the above technical problem, some embodiments of the present application provide a temperature control apparatus for a power supply conversion chip applied to a controller in a multi-phase power supply; each power supply conversion chip in the multi-phase power supply includes an accumulator having a first end connected to a current feedback end of the power supply conversion chip, a second end connected to a temperature feedback end of the power supply conversion chip, and an output end connected to a current signal input end of the controller, the accumulator configured to send a current temperature accumulation value after adding a current detection value and a temperature detection value of the power supply conversion chip to the controller; temperatures of the power supply conversion chips increase as output currents increase and decrease as the output currents decrease.

The apparatus includes:
 a calculation unit, configured to calculate a real-time average value of the current temperature accumulation values sent by the power supply conversion chips; and
 an adjustment unit, configured to adjust the output current of the power supply conversion chip with the current temperature accumulation value not equal to the real-time average value, whereby the current temperature accumulation value of the power supply conversion chip is the real-time average value.

To solve the above technical problem, some embodiments of the present application further provide a temperature control device for a power supply conversion chip, including a controller, a memory, a communication interface, and a communication bus, where the controller, the memory, and the communication interface completing communication with each other through the communication bus.

The memory is configured to store at least one executable instruction that causes the controller to perform operations of the above temperature control method for a power supply conversion chip.

To solve the above technical problem, some embodiments of the present application further provide a non-transitory computer-readable storage medium; the storage medium stores therein at least one executable instruction that, under a condition that executed on a temperature control device/apparatus for a power supply conversion chip, causes the temperature control device/apparatus for a power supply conversion chip to perform operations of the above temperature control method for a power supply conversion chip.

To solve the above technical problem, some embodiments of the present application further provide a multi-phase power supply apparatus, including the above temperature control device for a power supply conversion chip, and further including a plurality of power supply conversion chips.

Enable ends of the power supply conversion chips are connected to enable signal output ends of a controller and output ends, after being connected in parallel, are connected to a power supply end of an electric device, for the power supply conversion chips to enable upon receiving enable signals sent by the controller and to output currents based on control of the controller to supply power to the electric device.

In some embodiments, the power supply conversion chip includes:
  an accumulator, with a first end connected to a current feedback end of the power supply conversion chip where it is located, a second end connected to a temperature feedback end of the power supply conversion chip where it is located, and an output end connected to a current signal input end of the controller, the accumulator configured to send a current temperature accumulation value after adding a current detection value and a temperature detection value of the power supply conversion chip to the controller, whereby the controller monitors an output current and temperature of a power supply conversion chip where the accumulator is located.

In some embodiments, the temperature feedback ends of the power supply conversion chips, after being connected in parallel, are connected to a temperature signal input end of the controller.

The controller is further configured to control the power supply conversion chips to stop working under a condition that the temperature detection value received by the temperature signal input end thereof is greater than an overheating protection threshold.

In some embodiments, the apparatus further includes:
  a prompt module, connected to a prompt signal output end of the controller; and
  the controller is further configured to perform power supply conversion chip over-temperature prompt through the prompt module under a condition that the temperature detection value received by the temperature signal input end thereof is greater than the overheating protection threshold.

In some embodiments, the prompt module includes a display prompt module and/or a sound prompt module.

Some embodiments of the present application relate to the field of power electronics technology control, and disclose a temperature control method for a power supply conversion chip, a related assembly, and a multi-phase power supply apparatus. A real-time average value of current temperature accumulation values of power supply conversion chips is calculated, and the output current of the power supply conversion chip with the current temperature accumulation value not equal to the real-time average value is increased or decreased. The temperature of a power supply conversion chip increases as the output current increases and decreases as the output current decreases, and the temperature of the power supply conversion chip changes under a condition that the output current of the power supply conversion chip is adjusted, whereby temperature equalization of the power supply conversion chips may be ensured by enabling the current temperature accumulation values of the power supply conversion chips to be the real-time average value. According to the present application, the output current of the power supply conversion chips is adjusted, whereby the temperatures of the power supply conversion chips are equalized to avoid false triggering of over-temperature protection of a controller caused by the excess temperature of few power supply conversion chips, thereby ensuring stable power supply to an electric device.

BRIEF DESCRIPTION OF THE DRAWINGS

To explain technical solutions of the embodiments of the present application more clearly, a brief introduction will be made to drawings used in the prior art and the embodiments. It is obvious that the drawings in the description below are some embodiments of the present application, and those ordinarily skilled in the art may obtain other drawings according to these drawings without creative work.

DETAILED DESCRIPTION

Some embodiments of the present application provide a temperature control method for a power supply conversion chip, a related assembly, and a multi-phase power supply apparatus. Output currents of the power supply conversion chips are adjusted, whereby temperatures of the power supply conversion chips are equalized to avoid false triggering of over-temperature protection of the controller caused by excess temperatures of a few power supply conversion chips, thereby ensuring stable power supply to an electric device.

To make objects, technical solutions, and advantages of some embodiments of the present application clearer, the technical solutions in some embodiments of the present application are described clearly and completely in combination with drawings in some embodiments of the present application. Described embodiments are a part of the embodiments of the present application, but not the whole embodiments. All other embodiments obtained by the ordinarily skilled in the art based on the embodiments in the present application without creative work shall fall within scope of protection of the present application.

Figure 3:
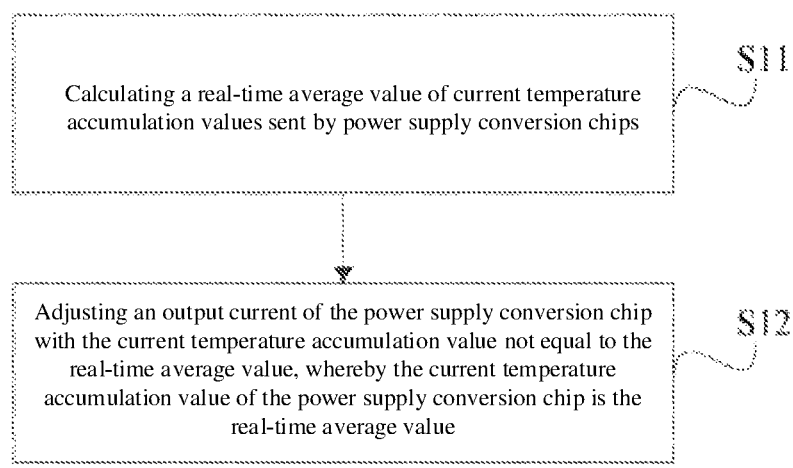
FIG. 3 is a flow diagram of a temperature control method for a power supply conversion chip according to some embodiments of the present application.

Referring to FIG. 3, FIG. 3 is a flow diagram of a temperature control method for a power supply conversion chip according to some embodiments of the present application. The method is applied to a controller in a multi-phase power supply. Each power supply conversion chip 101 in the multi-phase power supply includes an accumulator 202. The accumulator 202 includes a first end connected to a current feedback end of the power supply conversion chip, a second end connected to a temperature feedback end of the power supply conversion chip, and an output end connected to a current signal input end of the controller. The accumulator 202 is configured to send a current temperature accumulation value after adding a current detection value and a temperature detection value of the power supply conversion chip 101 to the controller. Temperatures of the power supply conversion chips 101 increase as output currents increase and decrease as the output currents decrease.

The method includes:

S11: Calculate a real-time average value of current temperature accumulation values sent by power supply conversion chips 101.

Considering that in the prior art, a controller usually has one temperature signal input end, and temperature feedback ends of the power supply conversion chips 101, after being connected in parallel, need to be connected to the temperature signal input end of the controller. Since the temperature detection value output by the temperature feedback end is actually a voltage analog quantity, a temperature detection value corresponding to the temperature signal input end of the controller is a maximum temperature detection value of each power supply conversion chip 101. Under a condition that the controller detects a power supply conversion chip 101 with a temperature abnormality based on the temperature detection value of its own temperature signal input end since a power supply conversion chip 101 with the temperature abnormality may not be determined, each power supply conversion chip 101 is controlled to stop working to avoid overheating and burning of the power supply conversion chips 101.

Figure 1:
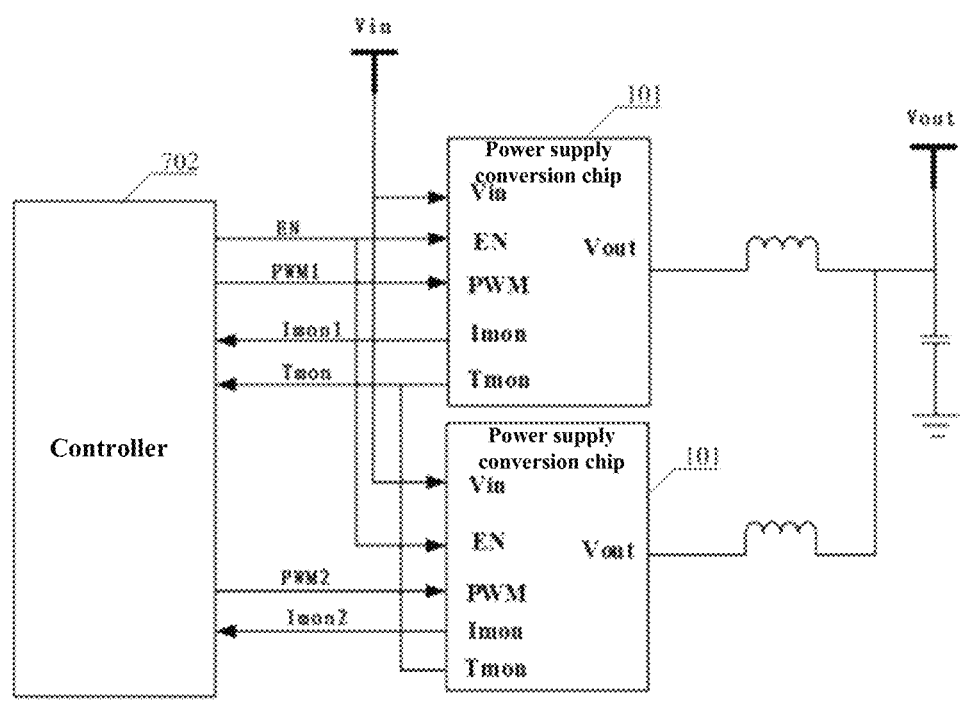
FIG. 1 is a structural diagram of a multi-phase power supply in the prior art.

In FIG. 1, Vin is an input voltage of power supply conversion chips 101. Vout is an output voltage of power supply conversion chips 101. EN is an enable signal. PWM1 is a control signal for controlling a first power supply conversion chip 101. PWM2 is a control signal for controlling a second power supply conversion chip 101. Imon1 is a current feedback value received by the controller from the first power supply conversion chip 101. Imon2 is a current feedback value received by the controller from the second power supply conversion chip 101. Tmon is a temperature feedback value received by the controller from two power supply conversion chips 101, namely, a maximum temperature detection value of the two power supply conversion chips 101.

However, at this time, the temperature of the power supply conversion chip 101 may increase because an ambient temperature is too high under a condition that a position of the power supply conversion chip 101 is arranged. Under a condition that each power supply conversion chip 101 is directly controlled to stop working, the power may not be supplied to a back-end electric device, and the electric device may not operate normally.

To solve an above technical problem, the present application considers that the controller includes a plurality of current signal input ends to receive the current detection value of each power supply conversion chip 101 to monitor the output current of each power supply conversion chip 101. Therefore, in the present application, each power supply conversion chip 101 is further provided with an accumulator 202. After accumulating the current detection value and the temperature detection value of the power supply conversion chip 101, the accumulator 202 sends the current temperature accumulation value obtained after an accumulation to the controller through the current signal input end of the controller. Based on this, the controller may receive current temperature accumulation values of the power supply conversion chips 101. Since the temperature of the power supply conversion chip 101 changes with the output current, under a condition that the current temperature accumulation value is too large, it may be determined that the temperature of the power supply conversion chip 101 is too high, thereby performing temperature adjustment for the power supply conversion chip 101 with excess temperature.

In some embodiments, the controller calculates a real-time average value of the current temperature accumulation values of the power supply conversion chips 101 after receiving the current temperature accumulation values of the power supply conversion chips 101, thereby determining whether the temperatures of the power supply conversion chips 101 are equalized.

S12: Adjust the output current of the power supply conversion chip 101 with the current temperature accumulation value not equal to the real-time average value, whereby the current temperature accumulation value of the power supply conversion chip 101 is the real-time average value.

After determining the real-time average value of the current temperature accumulation values of the power supply conversion chips 101, the output current of the power supply conversion chip 101 with the current temperature accumulation value not equal to the real-time average value is adjusted. Since the temperatures of the power supply conversion chips 101 change with the changes of the output currents, after adjusting the output currents, the temperatures of the power supply conversion chips 101 also change therewith. The current temperature accumulation value of each power supply conversion chip 101 is adjusted to the real-time average value to ensure the temperature equalization of each power supply conversion chip 101, and to avoid that each power supply conversion chip 101 may not work normally due to a certain power supply conversion chip 101 with excess temperature.

It should be noted that under a condition that a real-time average value is calculated and the output current of each power supply conversion chip 101 is adjusted based on the real-time average value, the current temperature accumulation value of each power supply conversion chip 101 at the current time and state is calculated and adjusted in real-time, to ensure the temperature equalization of each power supply conversion chip 101 at the current time and state. The real-time average value may also be calculated once every preset time. For example, the real-time average value of the received current temperature accumulation value of each power supply conversion chip 101 is calculated every one minute. And the output current of the power supply conversion chip 101 of which the current temperature accumulation value is not the real-time average value is adjusted, to ensure the temperature equalization of each power supply conversion chip 101. The present application does not define the time and frequency of the output current adjustment and may ensure the temperature equalization of each power supply conversion chip 101, avoiding that each power supply conversion chip 101 may not work normally due to a certain power supply conversion chip 101 with temperature abnormality.

In summary, according to the present application, the output current of the power supply conversion chips 101 is adjusted, whereby the temperatures of the power supply conversion chips 101 are equalized to avoid false triggering of over-temperature protection of the controller caused by the excess temperature of a few power supply conversion chips 101, thereby ensuring the stable power supply to an electric device. In some embodiments, the adjusting the output current of the power supply conversion chip 101 with the current temperature accumulation value not equal to the real-time average value, whereby the current temperature accumulation value of the power supply conversion chip 101 is the real-time average value includes:

comparing the current temperature accumulation values sent by the power supply conversion chips 101 with the real-time average value.

controlling the output current of the power supply conversion chip 101 with the current temperature accumulation value greater than the real-time average value to decrease, whereby the current temperature accumulation value of the power supply conversion chip 101 is the real-time average value, and controlling the output current of the power supply conversion chip 101 with the current temperature accumulation value less than the real-time average value to increase, whereby the current temperature accumulation value of the power supply conversion chip 101 is the real-time average value.

In some embodiments, after calculating the real-time average value of the current temperature accumulation values of the power supply conversion chips 101, under a condition that the output current of the power supply conversion chip 101 is adjusted, the current temperature accumulation value output by each power supply conversion chip 101 may first be compared with the real-time average value to determine the power supply conversion chip 101 with the current temperature accumulation value greater than the real-time average value and the power supply conversion chip 101 with the current temperature accumulation value less than the real-time average value. The output current of the power supply conversion chip 101 with the current temperature accumulation value greater than the real-time average value is controlled to decrease.

The output currents of the power supply conversion chips 101 with the current temperature accumulation values less than the real-time average value is controlled to increase, whereby the current temperature accumulation value of each power supply conversion chip 101 is the current real-time average value, that is, by adjusting the output current of the power supply conversion chips 101, the temperature of each power supply conversion chip 101 is kept equalized.

Figure 2A:
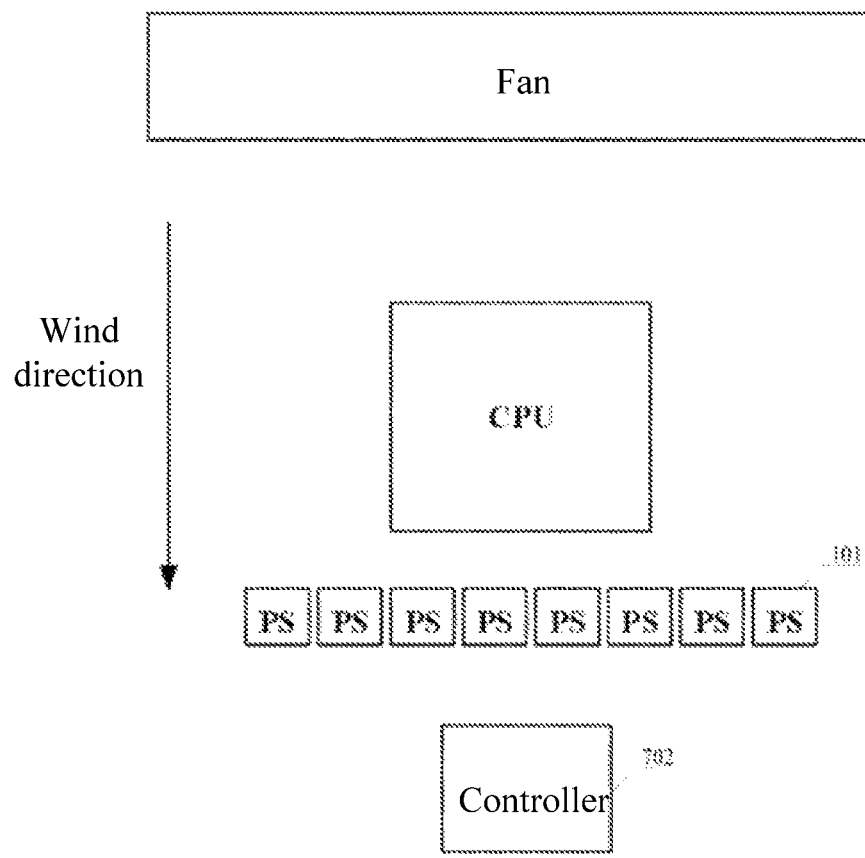
FIG. 2a is a diagram of an arrangement position of a first type power supply conversion chip in the prior art.
Figure 2B:
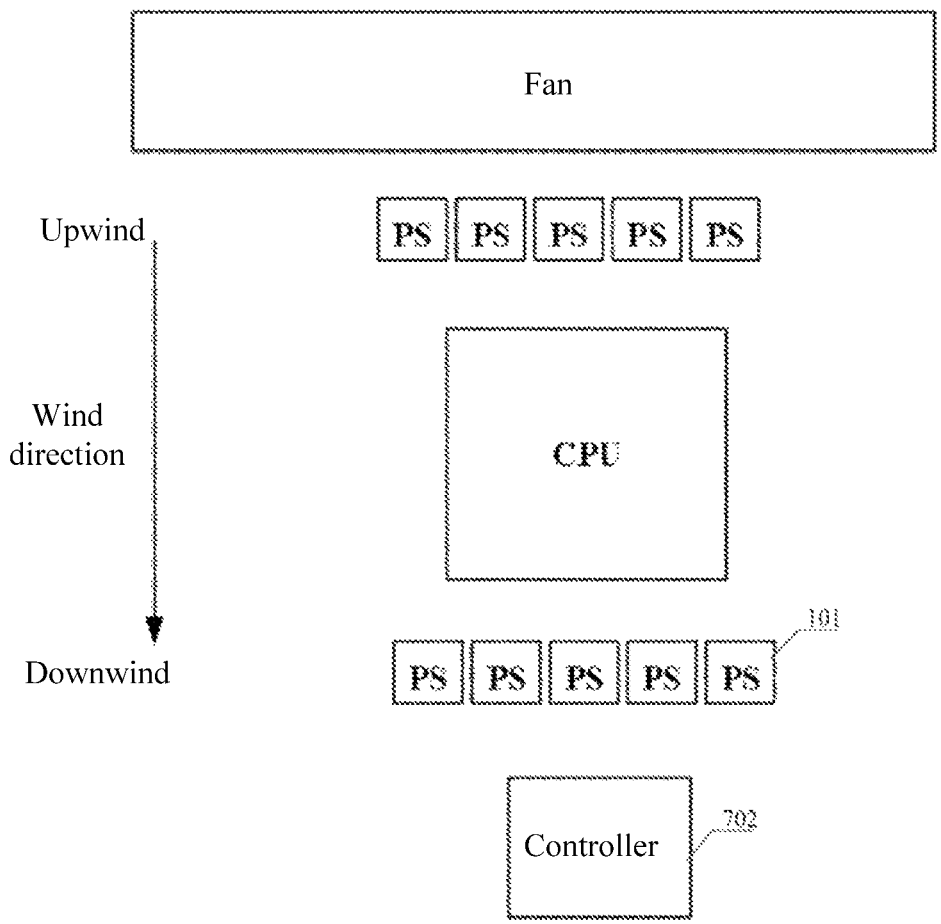
FIG. 2b is a diagram of an arrangement position of a second type power supply conversion chip in the prior art.

It should be noted that, as shown in FIG. 2b, the temperature of the five power supply conversion chips 101 which are closer to the fan, i.e. PS, is lower than the five power supply conversion chips 101 which are farther from the fan. The temperature of the five power supply conversion chips 101 which are farther from the fan is reduced by reducing the output currents of the five power supply conversion chips 101 which are farther from the fan. And the output current of the five power supply conversion chips 101 which are closer to the fan is increased to increase the temperatures of the five power supply conversion chips 101 which are farther from the fan. While ensuring temperature equalization of the power supply conversion chips 101, the sum of the output currents of the power supply conversion chips 101 may still complement each other to ensure a stable power supply for an electric device, such as the CPU in FIG. 2b.

In some embodiments, enable signal output ends of the controller are connected to enable ends of the power supply conversion chips 101. Output ends of the power supply conversion chips 101, after being connected in parallel, are connected to a power supply end of an electric device.

The calculating a real-time average value of the current temperature accumulation values sent by the power supply conversion chips 101 includes: sending enable signals to the power supply conversion chips 101 to enable the power supply conversion chips 101, adjusting the output currents of the power supply conversion chips 101 based on a power supply demand current of the electric device, and receiving, under a condition that the power supply conversion chips 101 supply power to the electric device, the current temperature accumulation values sent by the power supply conversion chips 101, and calculating the real-time average value.

In some embodiments, under a condition that calculating a real-time average value of the current temperature accumulation values sent by the power supply conversion chips 101, an enable signal may be sent to each power supply conversion chip 101 first to enable each power supply conversion chip 101, and an output current of each power supply conversion chip 101 is allocated according to the power supply demand current of the electric device to adjust the output current of each power supply conversion chip 101. For example, the output currents of each power supply conversion chip 101 may be controlled to be the same first. The output current of each power supply conversion chip 101 may be subsequently adjusted based on the real-time average value after calculating the real-time average value, which is not limited in the present application.

Figure 4:
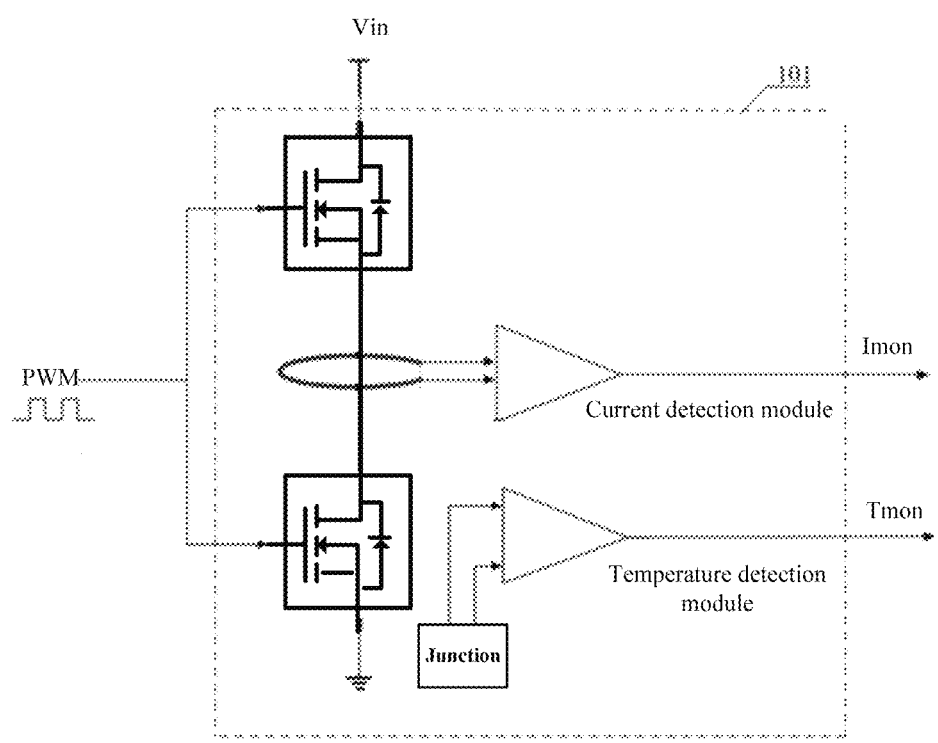
FIG. 4 is a structural diagram of a current detection module and a temperature detection module provided in a power supply conversion chip in the prior art.
Figure 5:
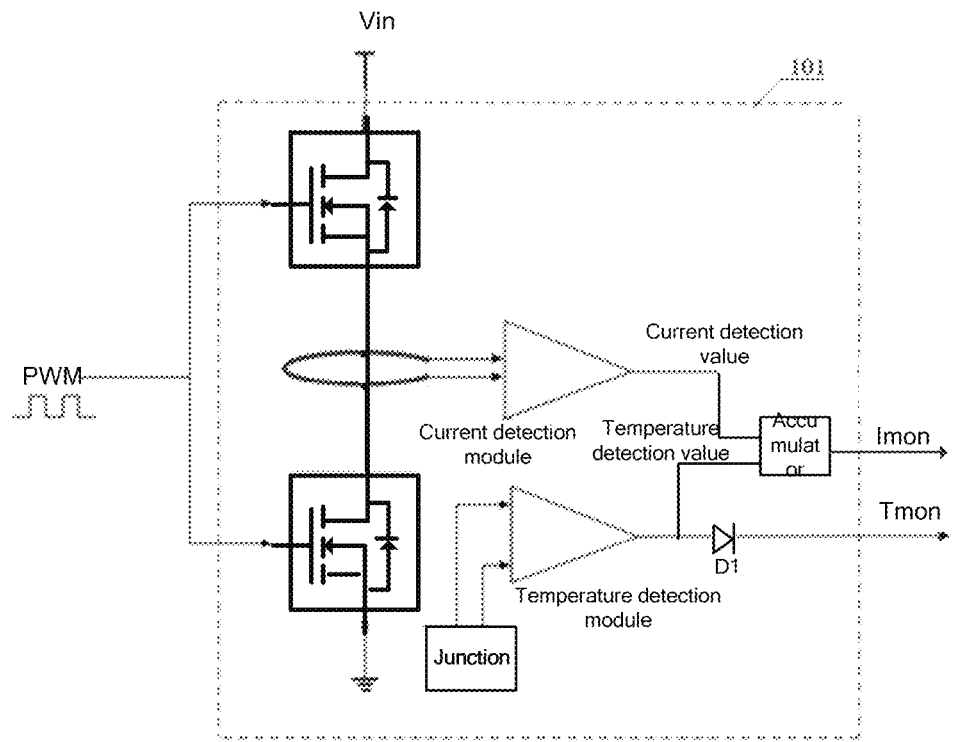
FIG. 5 is a structural diagram of an accumulator provided in a power supply conversion chip according to some embodiments of the present application.

It should be noted that the power supply conversion chip 101 includes a power conversion unit for converting an input voltage, and outputting the same after power conversion: Therefore, the power supply conversion chip 101 includes a first switch tube and a second switch tube. The first switch tube and the second switch tube are connected in series between the input voltage and a ground line. And the controller controls the first switch tube and the second switch tube by outputting pulse width modulation (PWM) signals, whereby the power supply conversion chip 101 converts the input voltage to output corresponding output current and output voltage. And of course, the controller adjusts the output voltage and output current of the corresponding power supply conversion chip 101 by adjusting the frequency and duty cycle of the PWM signal. The PWM signal for each power supply conversion chip 101 may be the same or different, depending on the desired output current for the power supply conversion chip 101. Referring to FIGS. 4 and 5, FIG. 4 is a structural diagram of a current detection module and a temperature detection module provided in a power supply conversion chip in the prior art. FIG. 5 is a structural diagram of an accumulator provided in a power supply conversion chip according to some embodiments of the present application. PWM in FIG. 4 is a control signal for controlling the first switch tube and the second switch tube of the power supply conversion chip in FIG. 4. Imon is a current feedback value, namely, a current detection value, received by a current signal input end of the controller. Tmon is a temperature feedback value, namely, a temperature detection value, received by a temperature signal input end of the controller. Imon in FIG. 5 is a current temperature accumulation value received by the current signal input end of the controller. Tmon is a temperature feedback value, namely, a temperature detection value, received by the temperature signal input end of the controller.

It should also be noted that the current detection module in the power supply conversion chip 101 may detect the current flowing through a connection point between the first switch tube and the second switch tube. This is not limited in the present application, and the output current of the power supply conversion chip 101 may be determined on this basis. Certainly, the temperature detection module may also detect a predetermined junction temperature, and this is also not limited in the present application. A corresponding amplifier may be provided in both the current detection module and the temperature detection module to amplify the detected current detection value and the temperature detection value to facilitate the controller to monitor the temperature and the output current of each power supply conversion chip 101.

In some embodiments, the temperature feedback ends of the power supply conversion chip 101, after being connected in parallel, are connected to the temperature signal input end of the controller.

After the adjusting the output current of the power supply conversion chip 101 with current temperature accumulation value not equal to the real-time average value, whereby the current temperature accumulation value of the power supply conversion chip 101 is the real-time average value, the method further includes:

determining whether the temperature detection value received by the temperature signal input end of the controller is greater than an overheating protection threshold, and in response to a determination that the temperature detection value of the temperature signal input end of the controller is greater than the overheating protection threshold, controlling the power supply conversion chips 101 to stop working.

In some embodiments, the controller not only determines whether the temperature of each power supply conversion chip 101 is equalized through its own current signal input end, but also is connected to the temperature feedback ends of each power supply conversion chip 101 that are connected in parallel through its temperature signal input end. Since the above temperature equalization of each power supply conversion chip 101 may be controlled, at this moment, under a condition that it is detected through the temperature signal input end that there is a power supply conversion chip 101 with a temperature detection value greater than the overheating protection threshold, it may be determined that the temperature of each power supply conversion chip 101 is too high. At this time, each power supply conversion chip 101 is not suitable for continuing to work, and each power supply conversion chip 101 may be directly controlled to stop working, to avoid the power supply conversion chip 101 from burning due to overheating.

In some embodiments, a prompt signal output end of the controller is connected to a prompt module. After the controlling the power supply conversion chips 101 to stop working, the method further includes the following step: performing power supply conversion chip 101 over-temperature prompt through the prompt module.

In some embodiments, after each power supply conversion chip 101 is controlled to stop working because the temperature detection value of the power supply conversion chip 101 is greater than the overheating protection threshold, the power supply conversion chip 101 over-temperature prompt is also performed through the prompt module, to prompt the staff that the temperature of the power supply conversion chip 101 is too high, whereby the staff may timely cool down the ambient temperature of the power supply conversion chip 101 or perform other processing, whereby the power supply conversion chip 101 may timely resume power supply to the electric device and improve working efficiency.

In some embodiments, the prompt module includes a display prompt module and/or a sound prompt module. The performing power supply conversion chip 101 over-temperature prompt through the prompt module includes: performing power supply conversion chip 101 over-temperature display prompt through the display prompt module and/or performing power supply conversion chip 101 over-temperature sound prompt through the sound prompt module.

The prompt module in some embodiments may, but is not limited to, include a display prompt module and/or a sound prompt module. The power supply conversion chip 101 over-temperature display prompt may be performed through the display module, whereby the staff may timely obtain warning information about the overheating of the power supply conversion chip 101 in a noisy environment. The power supply conversion chip 101 over-temperature sound prompt may be performed through the sound module, whereby the staff may timely obtain warning information about the overheating of the power supply conversion chip 101 in an environment where the sight line is obstructed.

The display prompt module may be but is not limited to, an indicator light, which may provide a power supply conversion chip 101 over-temperature display prompt for the staff after the indicator light is lit and may also be a display screen, and a corresponding prompt frame pops up on the display screen to perform the power supply conversion chip 101 over-temperature display prompt.

The sound display module may be, but is not limited to, a loudspeaker. The loudspeaker plays a preset audio frequency to give the staff a power supply conversion chip 101 over-temperature sound prompt.

In some embodiments, the power supply conversion chip 101 further includes an anti-reflection diode D1. The anti-reflection diode D1 includes an input end connected to the temperature feedback end of the power supply conversion chip and an output end connected to the temperature signal input end of the controller.

Since the temperature feedback ends of the power supply conversion chips 101, after being connected in parallel, need to be connected to the temperature signal input end of the controller, to avoid the power supply conversion chip 101 with a higher temperature detection value affecting the temperature information about the power supply conversion chip 101 with a lower temperature detection value, namely, affecting the current temperature accumulation value of the power supply conversion chip 101 with the lower temperature detection value. In some embodiments, the anti-reflection diode D1 is arranged in the temperature feedback end, to ensure that the temperature detection value of each power supply conversion chip 101 may be output and may not be input, preventing backflow, and ensuring the accuracy of the current temperature accumulation value of the power supply conversion chip 101.

Figure 6:
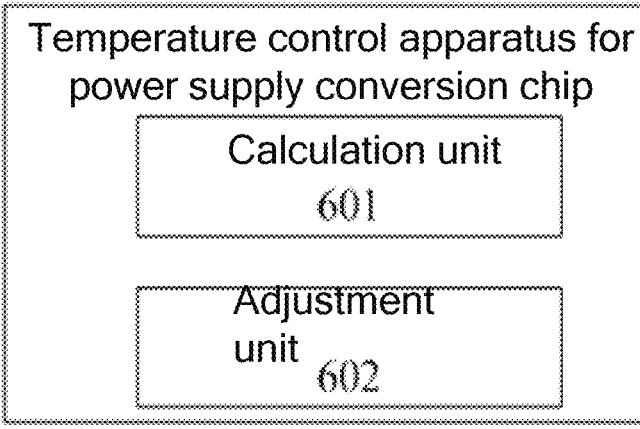
FIG. 6 is a structural diagram of a temperature control apparatus for a power supply conversion chip according to some embodiments of the present application.

Referring to FIG. 6, FIG. 6 is a structural diagram of a temperature control apparatus for a power supply conversion chip according to some embodiments of the present application. The apparatus is applied to a controller in a multi-phase power supply. Each power supply conversion chip in the multi-phase power supply includes an accumulator. The accumulator includes a first end connected to a current feedback end of the power supply conversion chip, a second end connected to a temperature feedback end of the power supply conversion chip, and an output end connected to a current signal input end of the controller. The accumulator is configured to send a current temperature accumulation value after adding a current detection value and a temperature detection value of the power supply conversion chip to the controller. Temperatures of the power supply conversion chips increase as output currents increase and decrease as the output currents decrease.

The apparatus includes: a calculation unit 601, configured to calculate a real-time average value of the current temperature accumulation values sent by the power supply conversion chips, and an adjustment unit 602, configured to adjust the output current of the power supply conversion chip with the current temperature accumulation value not equal to the real-time average value, whereby the current temperature accumulation value of the power supply conversion chip is the real-time average value.

In some embodiments, the adjustment unit is configured to: compare the current temperature accumulation values sent by the power supply conversion chips with the real-time average value, control the output current of the power supply conversion chip with the current temperature accumulation value greater than the real-time average value to decrease, whereby the current temperature accumulation value of the power supply conversion chip is the real-time average value, and control the output current of the power supply conversion chip with the current temperature accumulation value less than the real-time average value to increase, whereby the current temperature accumulation value of the power supply conversion chip is the real-time average value.

In some embodiments, enable signal output ends of the controller are connected to enable ends of the power supply conversion chips. Output ends of the power supply conversion chips, after being connected in parallel, are connected to a power supply end of an electric device.

The calculation unit is configured to: send enable signals to the power supply conversion chips to enable the power supply conversion chips, adjust the output currents of the power supply conversion chips based on a power supply demand current of the electric device. And receive, under a condition that the power supply conversion chips supply power to the electric device, the current temperature accumulation values sent by the power supply conversion chips, and calculating the real-time average value.

In some embodiments, the temperature feedback ends of the power supply conversion chips, after being connected in parallel, are connected to a temperature signal input end of the controller.

The temperature control apparatus for a power supply conversion chip is further configured to, after the adjusting the output current of the power supply conversion chip with the current temperature accumulation value not equal to the real-time average value by the adjustment unit, whereby the current temperature accumulation value of the power supply conversion chip is the real-time average value:

determine whether the temperature detection value received by the temperature signal input end of the controller is greater than an overheating protection threshold, and in response to a determination that the temperature detection value of the temperature signal input end of the controller is greater than the overheating protection threshold, control the power supply conversion chips to stop working.

In some embodiments, the prompt signal output end of the controller is connected to a prompt module. The temperature control apparatus for a power supply conversion chip is further configured to, after controlling each power supply conversion chip to stop working: perform power supply conversion chip over-temperature prompt through the prompt module.

In some embodiments, the prompt module includes a display prompt module and/or a sound prompt module. The temperature control apparatus for a power supply conversion chip is configured to: perform power supply conversion chip over-temperature display prompt through the display prompt module and/or perform power supply conversion chip over-temperature sound prompt through the sound prompt module.

In some embodiments, each power supply conversion chip further includes an anti-reflection diode, with an input end connected to the temperature feedback end of the power supply conversion chip and an output end connected to the temperature signal input end of the controller.

A description of the temperature control apparatus for a power supply conversion chip according to some embodiments of the present application is provided concerning the above method embodiments, and the present application will not be repeated here.

Figure 7:
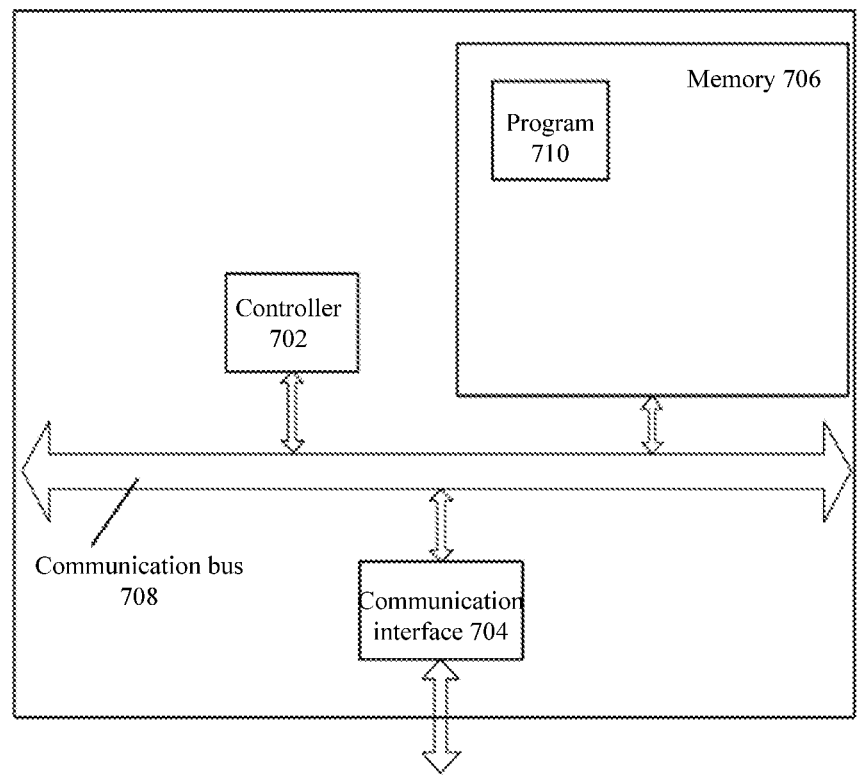
FIG. 7 is a structural diagram of a temperature control device for a power supply conversion chip according to some embodiments of the present application.
Figure 8:
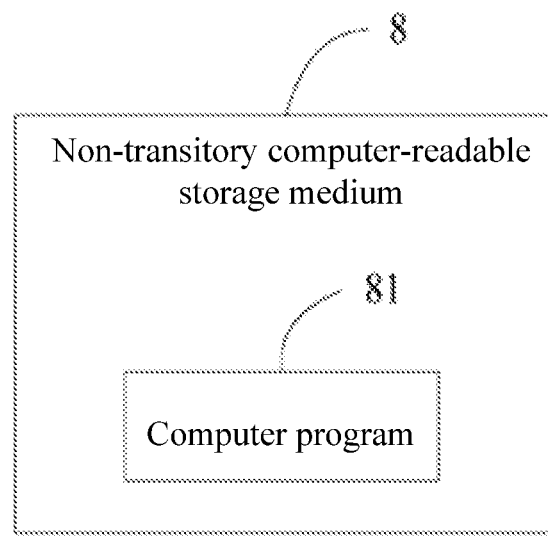
FIG. 8 is a structural diagram of a non-transitory computer-readable storage medium according to some embodiments of the present application.

Referring to FIG. 7, FIG. 7 is a structural diagram of a temperature control device for a power supply conversion chip according to some embodiments of the present application, and the present application does not limit the implementation of the temperature control device for a power supply conversion chip. As shown in FIG. 7, the temperature control device for a power supply conversion chip may include a controller 702, a communication interface 704, a memory 706, and a communication bus 708.

The controller 702, communication interface 704, and memory 706 complete communication with each other through communication bus 708. The communication interface 704 is configured to communicate with other devices such as clients, other servers, or other network elements. The controller 702 is configured to execute program 710, which may perform the related steps in the embodiment of the above temperature control method for a power supply conversion chip.

In some embodiments, program 710 may include program codes including computer-executable instructions.

The controller 702 may be a CPU, an application-specific integrated circuit (ASIC), or one or more integrated circuits configured to implement some embodiments of the present application. The temperature control device for a power supply conversion chip includes one or more controllers, which may be the same type of controller, such as one or more CPUs, or may be different types of controllers, such as one or more CPUs and one or more ASICs.

The memory 706 is configured to store the program 710. The memory 706 may contain high-speed random-access memory (RAM), and may also include non-transitory memory, such as at least one disk memory.

The program 710 may be called by the controller 702 to cause the temperature control device for a power supply conversion chip to perform the following operations: calculating a real-time average value of the current temperature accumulation values sent by the power supply conversion chips, and adjusting the output current of the power supply conversion chip with the current temperature accumulation value not equal to the real-time average value, whereby the current temperature accumulation value of the power supply conversion chip is the real-time average value.

In some embodiments, the adjusting the output current of the power supply conversion chip with the current temperature accumulation value not equal to the real-time average value, whereby the current temperature accumulation value of the power supply conversion chip is the real-time average value includes: comparing the current temperature accumulation values sent by the power supply conversion chips with the real-time average value, controlling the output current of the power supply conversion chip with the current temperature accumulation value greater than the real-time average value to decrease, whereby the current temperature accumulation value of the power supply conversion chip is the real-time average value, and control the output current of the power supply conversion chip with the current temperature accumulation value less than the real-time average value to increase, whereby the current temperature accumulation value of the power supply conversion chip is the real-time average value.

In some embodiments, enable signal output ends of the controller are connected to enable ends of the power supply conversion chips. Output ends of the power supply conversion chips, after being connected in parallel, are connected to a power supply end of an electric device.

The calculating a real-time average value of the current temperature accumulation values sent by the power supply conversion chips includes: sending enable signals to the power supply conversion chips to enable the power supply conversion chips, adjusting the output currents of the power supply conversion chips based on the power supply demand current of the electric device, and receiving, under a condition that the power supply conversion chips supply power to the electric device, the current temperature accumulation values sent by the power supply conversion chips, and calculating the real-time average value.

In some embodiments, the temperature feedback ends of the power supply conversion chips, after being connected in parallel, are connected are connected to a temperature signal input end of the controller.

The programs 710 are called by the controller 702 to cause the temperature control device for a power supply conversion chip to perform the following operations:

after the adjusting the output current of the power supply conversion chip with the current temperature accumulation value not equal to the real-time average value, whereby the current temperature accumulation value of the power supply conversion chip is the real-time average value, further including: determining whether the temperature detection value received by the temperature signal input end of the controller is greater than an overheating protection threshold, and in response to a determination that the temperature detection value of the temperature signal input end of the controller is greater than an overheating protection threshold, controlling the power supply conversion chips to stop working.

In some embodiments, a prompt signal output end of the controller is connected to a prompt module.

The programs 710 are called by the controller 702 to cause the temperature control device for a power supply conversion chip to perform the following operations:

after the controlling the power supply conversion chips to stop working, further including: performing power supply conversion chip over-temperature prompt through the prompt module.

In some embodiments, the prompt module includes a display prompt module and/or a sound prompt module.

The programs 710 are called by the controller 702 to cause the temperature control device for a power supply conversion chip to perform the following operations:

the performing power supply conversion chip over-temperature prompt through the prompt module including: performing power supply conversion chip over-temperature display prompt through the display prompt module and/or performing power supply conversion chip over-temperature sound prompt through the sound prompt module.

In some embodiments, each power supply conversion chip further includes an anti-reflection diode, with an input end connected to the temperature feedback end of the power supply conversion chip and an output end connected to the temperature signal input end of the controller.

A description of the temperature control device for a power supply conversion chip according to some embodiments of the present application is provided concerning the above method embodiments, and the present application will not be repeated here.

The non-transitory computer-readable storage medium 8 in some embodiments of the present application has stored thereon computer programs 81. The computer programs 81, under a condition that executed by the controller, implement the steps of the above temperature control method for a power supply conversion chip.

Reference is made to the above method embodiments for the description of the non-transitory computer-readable storage medium provided by some embodiments of the present application, and the present application will not be repeated here.

Some embodiments of the present application provide a multi-phase power supply apparatus, which includes the above temperature control device for a power supply conversion chip, and further includes a plurality of power supply conversion chips.

Enable ends of the power supply conversion chips are connected to enable signal output ends of a controller and output ends, after being connected in parallel, are connected to a power supply end of an electric device. The power supply conversion chips are configured to enable upon receiving enable signals sent by the controller and to output currents based on control of the controller to supply power to the electric device.

In some embodiments, the power supply conversion chip includes: an accumulator. The accumulator includes a first end connected to a current feedback end of the power supply conversion chip where it is located, a second end connected to a temperature feedback end of the power supply conversion chip where it is located, and an output end connected to a current signal input end of the controller. The accumulator is configured to send a current temperature accumulation value after adding a current detection value and a temperature detection value of the power supply conversion chip to the controller, whereby the controller monitors an output current and temperature of a power supply conversion chip where the accumulator is located.

In some embodiments, the temperature feedback ends of the power supply conversion chips, after being connected in parallel, are connected are connected to a temperature signal input end of the controller.

The controller is further configured to control the power supply conversion chips to stop working under a condition that the temperature detection value received by the temperature signal input end thereof is greater than an overheating protection threshold.

In some embodiments, the apparatus further includes: a prompt module, connected to a prompt signal output end of the controller. And the controller being further configured to perform power supply conversion chip over-temperature prompt through the prompt module under a condition that the temperature detection value received by the temperature signal input end thereof is greater than the overheating protection threshold.

In some embodiments, the prompt module includes a display prompt module and/or a sound prompt module.

Reference is made to the above method embodiments for the description of the multi-phase power supply apparatus provided by some embodiments of the present application, and the present application will not be repeated here.

It should also be noted that the use of relational terms such as first and second, and the like in the specification are used solely to distinguish one entity or operation from another entity or operation without necessarily requiring or implying any actual such relationship or order between such entities or operations. Moreover, the terms "include", "contain", or any other variation thereof, are intended to cover a non-exclusive inclusion, such that a process, method, article, or device that includes a list of elements does not only include those elements but may include other elements not expressly listed or inherent to such process, method, article, or device. An element proceeded by "include a . . . " does not, without more constraints, preclude the existence of additional identical elements in the process, method, article, or device that includes the element.

The previous description of the disclosed embodiments is provided to enable the skilled in the art to implement or use the present application. Various modifications to these embodiments will be readily apparent to the skilled in the art, and the generic principles defined herein may be implemented in other embodiments without departing from the spirit or scope of the present application. Therefore, the present application will not be limited to these embodiments shown herein but will conform to the broadest scope consistent with the principles and novel features disclosed herein.

The invention claimed is:

1. A temperature control method for a power supply conversion chip, being applied to a controller in a multi-phase power supply, wherein each power supply conversion chip in the multi-phase power supply comprises an accumulator having
    a first end connected to a current feedback end of the power supply conversion chip,
    a second end connected to a temperature feedback end of the power supply conversion chip, and
    an output end connected to a current signal input end of the controller,
    wherein the accumulator is configured to send a current temperature accumulation value after adding a current detection value and a temperature detection value of the power supply conversion chip to the controller, and temperatures of power supply conversion chips increase as output currents increase and decrease as the output currents decrease; and the method comprising:
    calculating a real-time average value of the current temperature accumulation values sent by the power supply conversion chips; and
    adjusting the output current of the power supply conversion chip with the current temperature accumulation value not equal to the real-time average value, whereby the current temperature accumulation value of the power supply conversion chip is the real-time average value.

2. The temperature control method for a power supply conversion chip according to claim 1, wherein the adjusting the output current of the power supply conversion chip with the current temperature accumulation value not equal to the real-time average value, whereby the current temperature accumulation value of the power supply conversion chip is the real-time average value comprises:
    comparing the current temperature accumulation values sent by the power supply conversion chips with the real-time average value;
    controlling the output current of the power supply conversion chip with the current temperature accumulation value greater than the real-time average value to decrease, whereby the current temperature accumulation value of the power supply conversion chip is the real-time average value; and
    controlling the output current of the power supply conversion chip with the current temperature accumulation value less than the real-time average value to increase, whereby the current temperature accumulation value of the power supply conversion chip is the real-time average value.

3. The temperature control method for a power supply conversion chip according to claim 1, wherein the calculating a real-time average value of the current temperature accumulation values sent by the power supply conversion chips comprises:
    calculating the real-time average value of the current temperature accumulation values sent by the power supply conversion chips according to a preset time interval.

4. The temperature control method for a power supply conversion chip according to claim 1, wherein enable signal output ends of the controller are connected to enable ends of the power supply conversion chips; output ends of the power supply conversion chips, after being connected in parallel, are connected to a power supply end of an electric device; and
    the calculating a real-time average value of the current temperature accumulation values sent by the power supply conversion chips comprises:
    sending enable signals to the power supply conversion chips to enable the power supply conversion chips;
    adjusting the output currents of the power supply conversion chips based on a power supply demand current of the electric device; and
    receiving, under a condition that the power supply conversion chips supply power to the electric device, the current temperature accumulation values sent by the power supply conversion chips, and calculating the real-time average value.

5. The temperature control method for a power supply conversion chip according to claim 1, wherein temperature feedback ends of the power supply conversion chips, after being connected in parallel, are connected to a temperature signal input end of the controller; and after the adjusting the output current of the power supply conversion chip with the current temperature accumulation value not equal to the real-time average value, whereby the current temperature accumulation value of the power supply conversion chip is the real-time average value, the method further comprises:

determining whether the temperature detection value of the temperature signal input end of the controller is greater than an overheating protection threshold; and in response to a determination that the temperature detection value of the temperature signal input end of the controller is greater than the overheating protection threshold, controlling the power supply conversion chips to stop working.

6. The temperature control method for a power supply conversion chip according to claim 5, wherein a prompt signal output end of the controller is connected to a prompt module; and after the controlling the power supply conversion chips to stop working, the method further comprises:

performing power supply conversion chip over-temperature prompt through the prompt module.

7. The temperature control method for a power supply conversion chip according to claim 6, wherein the prompt module comprises at least one of a display prompt module or a sound prompt module; and the performing power supply conversion chip over-temperature prompt through the prompt module comprises at least one of:

performing power supply conversion chip over-temperature display prompt through the display prompt module or performing power supply conversion chip over-temperature sound prompt through the sound prompt module.

8. The temperature control method for a power supply conversion chip according to claim 5, wherein each of the power supply conversion chips further comprises an anti-reflection diode having an input end connected to the temperature feedback end of the power supply conversion chip, and an output end connected to the temperature signal input end of the controller.

9. A multi-phase power supply apparatus, comprising a temperature control device for a power supply conversion chip, wherein the temperature control device for the power supply conversion chip comprises: a controller in a multi-phrase power supply, a memory, a communication interface, and a communication bus, wherein the controller, the memory, and the communication interface complete communication with each other through the communication bus;

the memory is configured to store at least one executable instruction that causes the controller to perform operations of a temperature control method for a power supply conversion chip;

each power supply conversion chip in the multi-phase power supply comprises an accumulator having a first end connected to a current feedback end of the power supply conversion chip, a second end connected to a temperature feedback end of the power supply conversion chip, and an output end connected to a current signal input end of the controller, wherein the accumulator is configured to send a current temperature accumulation value after adding a current detection value and a temperature detection value of the power supply conversion chip to the controller, and temperatures of power supply conversion chips increase as output currents increase and decrease as the output currents decrease; and the controller, upon execution of the computer-readable instructions, is configured to:

calculate a real-time average value of the current temperature accumulation values sent by the power supply conversion chips; and adjust the output current of the power supply conversion chip with the current temperature accumulation value not equal to the real-time average value, whereby the current temperature accumulation value of the power supply conversion chip is the real-time average value; and the multi-phase power supply apparatus further comprises the power supply conversion chips, wherein enable ends of the power supply conversion chips are connected to enable signal output ends of the controller, and output ends of the power supply conversion chips, after being connected in parallel, are connected to a power supply end of an electric device, and the power supply conversion chips are configured to enable upon receiving enable signals sent by the controller and to output currents based on control of the controller to supply power to the electric device.

10. The multi-phase power supply apparatus according to claim 9, wherein the controller is configured to monitor an output current and temperature of a power supply conversion chip where the accumulator is located.

11. The multi-phase power supply apparatus according to claim 9, wherein temperature feedback ends of the power supply conversion chips, after being connected in parallel, are connected to a temperature signal input end of the controller; and the controller is further configured to control the power supply conversion chips to stop working under a condition that the temperature detection value received by the temperature signal input end of the controller is greater than an overheating protection threshold.

12. The multi-phase power supply apparatus according to claim 11, further comprising a prompt module connected to a prompt signal output end of the controller; and the controller is further configured to perform power supply conversion chip over-temperature prompt through the prompt module under a condition that the temperature detection value received by the temperature signal input end of the controller is greater than the overheating protection threshold.

13. The multi-phase power supply apparatus according to claim 12, wherein the prompt module comprises at least one of a display prompt module or a sound prompt module.

14. The multi-phase power supply apparatus according to claim 9, wherein each of the power supply conversion chips further comprises a first switch tube and a second switch tube;

the first switch tube and the second switch tube are connected in series between an input voltage and a ground line; and the controller controls the first switch tube and the second switch tube by outputting a pulse width modulation (PWM) signal, whereby the power supply conversion chip converts the input voltage and outputs a corresponding output current and output voltage.

15. The multi-phase power supply apparatus according to claim 14, wherein the controller adjusts the output voltage and output current of the corresponding power supply conversion chip by adjusting frequency and a duty cycle of the PWM signal.

16. The multi-phase power supply apparatus according to claim 14, wherein each of the power supply conversion chips further comprises a current detection module, and the current detection module is configured to detect a current flowing through a connection point between the first switch tube and the second switch tube.

17. The multi-phase power supply apparatus according to claim 9, wherein each of the power supply conversion chips further comprises a temperature detection module, and the temperature detection module is configured to detect a predetermined junction temperature.

18. The multi-phase power supply apparatus according to claim 16, wherein an amplifier is provided in the current detection module to amplify the current detection value.

19. The multi-phase power supply apparatus according to claim 17, wherein an amplifier is provided in the temperature detection module to amplify the temperature detection value.

20. A temperature control device for a power supply conversion chip, comprising a controller in a multi-phrase power supply, a memory, a communication interface, and a communication bus, wherein the controller, the memory, and the communication interface complete communication with each other through the communication bus;
  the memory is configured to store at least one executable instruction that causes the controller to perform operations of a temperature control method for a power supply conversion chip;
  each power supply conversion chip in the multi-phase power supply comprises an accumulator having
    a first end connected to a current feedback end of the power supply conversion chip,
    a second end connected to a temperature feedback end of the power supply conversion chip, and
    an output end connected to a current signal input end of the controller,
    wherein the accumulator is configured to send a current temperature accumulation value after adding a current detection value and a temperature detection value of the power supply conversion chip to the controller, and temperatures of power supply conversion chips increase as output currents increase and decrease as the output currents decrease; and
  the controller, upon execution of the computer-readable instructions, is configured to:
    calculate a real-time average value of the current temperature accumulation values sent by the power supply conversion chips; and
    adjust the output current of the power supply conversion chip with the current temperature accumulation value not equal to the real-time average value, whereby the current temperature accumulation value of the power supply conversion chip is the real-time average value.

* * * * *